United States Patent
Husain et al.

(10) Patent No.: US 7,356,064 B2
(45) Date of Patent: Apr. 8, 2008

(54) POLARIZATION SWITCHING AND CONTROL IN VERTICAL CAVITY SURFACE EMITTING LASERS

(75) Inventors: Anis Husain, San Diego, CA (US); Ashok V. Krishnamoorthy, San Diego, CA (US)

(73) Assignee: Ziva, Inc., San Diego, CA (US)

( * ) Notice: Subject to any disclaimer, the term of this patent is extended or adjusted under 35 U.S.C. 154(b) by 178 days.

(21) Appl. No.: 11/386,220

(22) Filed: Mar. 21, 2006

(65) Prior Publication Data

US 2006/0239308 A1    Oct. 26, 2006

Related U.S. Application Data

(63) Continuation of application No. 10/686,208, filed on Oct. 14, 2003, now Pat. No. 7,016,381.

(60) Provisional application No. 60/510,638, filed on Oct. 11, 2003, provisional application No. 60/417,884, filed on Oct. 11, 2002.

(51) Int. Cl.
H01S 5/00 (2006.01)
H01S 3/13 (2006.01)
H01S 3/097 (2006.01)
H01S 3/08 (2006.01)

(52) U.S. Cl. ............................ 372/50.124; 372/29.013; 372/87; 372/92

(58) Field of Classification Search ........... 372/29.013, 372/50.124, 87, 92
See application file for complete search history.

(56) References Cited

U.S. PATENT DOCUMENTS

| | | | |
|---|---|---|---|
| 4,943,970 A * | 7/1990 | Bradley | 372/45.01 |
| 5,245,622 A | 9/1993 | Jewell et al. | |
| 5,727,014 A | 3/1998 | Wang et al. | |
| 5,986,996 A | 11/1999 | Kitamura et al. | |
| 5,991,326 A | 11/1999 | Yuen et al. | |
| 5,995,531 A | 11/1999 | Gaw et al. | |
| 6,040,590 A | 3/2000 | OBrien et al. | |
| 6,134,251 A * | 10/2000 | Kawase et al. | 372/27 |
| 6,356,573 B1 | 3/2002 | Jonsson et al. | |
| 6,399,407 B1 | 6/2002 | O'Brien et al. | |
| 6,493,368 B1 | 12/2002 | Chirovsky et al. | |
| 6,507,595 B1 * | 1/2003 | Kapon et al. | 372/45.013 |
| 6,631,152 B2 | 10/2003 | Kaneko et al. | |
| 6,650,683 B2 | 11/2003 | Ueki et al. | |
| 6,680,965 B2 * | 1/2004 | Kinoshita | 372/96 |

* cited by examiner

*Primary Examiner*—Minsun Oh Harvey
*Assistant Examiner*—Phillip Nguyen
(74) *Attorney, Agent, or Firm*—Fish & Richardson P.C.

(57) ABSTRACT

A fast current-controlled polarization switching VCSEL with two independent intra-cavity p-contact electrodes and two independent intra-cavity n-contact electrodes positioned along the four sides of the symmetric aperture such that there are two independent p- and n-contact pairs placed on opposite sides of the aperture in a non-overlapping configuration. The anisotropy resulting from the unidirectional current flow causes the light output to be polarized perpendicular to the direction of current flow. A VCSEL driver circuit switches the polarization state of the output light by using the two orthogonal pairs of non-overlapping intra-cavity contacted electrodes to change the direction of current flow into the VCSEL aperture by 90 degrees.

20 Claims, 11 Drawing Sheets

POLARIZATION SWITCHING AND CONTROL IN VERTICAL CAVITY SURFACE EMITTING LASERS

CROSS-REFERENCE TO RELATED PATENT APPLICATIONS

This application is a continuation application of U.S. application Ser. No. 10/686,208 entitled "Current-Controlled Polarization Switching Vertical Cavity Surface Emitting Laser" and filed on Oct. 14, 2003 (published as U.S. Publication No. 2004/0136418 A1 and granted as U.S. Pat. No. 7,016,381). The disclosures of U.S. Publication No. 2004/0136418 A1 and granted U.S. Pat. No. 7,016,381 are incorporated by reference as part of this application.

The U.S. application Ser. No. 10/686,208 claims the benefit of priority under 35 U.S.C. §119(e) from U.S. Provisional Patent Application No. 60/417,884, filed Oct. 11, 2002 by Ashok V. Krishnamoorthy and Anis Husain and entitled "Current-controlled polarization switching VCSEL," which is incorporated herein by reference in its entirety and for all purposes.

The U.S. application Ser. No. 10/686,208 also claims the benefit of priority under 35 U.S.C. §119(e) from the U.S. Provisional Patent Application No. 60/510,638, filed Oct. 10, 2003 by Ashok V. Krishnamoorthy and Anis Husain and entitled "Driver for Polarization-Switching VCSEL and Method of Operation," which is incorporated herein by reference in its entirety and for all purposes.

BACKGROUND OF THE INVENTION

1. Field of the Invention

The present invention relates generally to solid state lasers, and more particularly relates to the polarization switching of vertical cavity surface emitting lasers, or VCSELs.

2. Description of the Related Art

Optical interconnections and transceivers are currently being used to provide reliable interconnections between electronic components that can scale in both distance and speed. The VCSEL technology has had a substantial impact on this industry as a low-cost, wafer-scale, and high-speed device that can be directly driven by low-cost silicon circuits. For reasons of manufacturing cost, packaging costs and performance, current-injection (or current-modulation) VCSELs have dominated the low-cost, short reach markets for transceivers in the 1-10 Gigabit per second (Gbit/s) range. However, these conventional current-injection VCSELs are, for numerous reasons, bandwidth limited.

For example, the current-injection VCSELs exhibit RC limits due to charging and discharging of the VCSEL and electrode (i.e., the contacts) capacitances. Electrode capacitance can be eliminated by suitable design of non-overlapping intra-cavity contacts placed on opposite sides of the cavity to avoid lateral electrode overlap. However, VCSEL intrinsic capacitance (i.e., the active-layer capacitance), to date, cannot be easily reduced. While the intrinsic bandwidth ($f_{max}$) of VCSELs, based on their fundamental material properties, can theoretically be in excess of 90 Gigahertz (GHz), the RC limits due to the charging and discharging of the VCSEL and electrode capacitances have limited the operating bandwidth to about 20 GHz for even the fastest conventional VCSELs. Additionally, the conventional current-injection VCSEL experiences detrimental carrier transport effects related to movement and re-distribution of carriers in active region. Further, heating effects caused by current modulation reduces the intrinsic bandwidth ($f_{max}$) of a VCSEL. Finally, mode-competition negatively effects the multi-modal VCSELs.

Conventional VCSEL structures also typically have random polarization states. Much work has been done in the art to attempt to understand the dynamics of the polarization behavior of VCSELs. In a typical prior art VCSEL, as the injected current is varied, the polarization state can exhibit hysteresis and noisy behavior. This makes the polarization state of the output light difficult to predict and control. However, it is known that one may "fix" the polarization state of a conventional VCSEL by introducing an asymmetry into the cavity structure through the use of mechanical strain. Mechanisms used to apply the strain in different directions in order to switch the polarization have been proposed. However, due to the need to mechanically alter the stress, these proposed switching mechanisms are inherently slow.

It is also known in the art that by designing a VCSEL with a rectangular aperture, the polarization state of the output light prefers to align along the direction of the longer axis of the rectangular aperture. Further, polarization switching VCSEL designs based on the intersection of such rectangular aperture regions and switching current flow along the corresponding longer axes have been proposed. Aside from even more complex aperture geometries and associated processing complexities, such designs necessitate a more substantial movement and re-distribution of carriers in the active region of the VCSEL, which tends to reduce the maximum rate of switching between the preferred polarization states.

It has also been observed that it is possible to substantially fix the polarization of a square cavity VCSEL by using asymmetric non-overlapping electrodes to preferentially inject current along one lateral axis of the cavity. The proposed structure used a multi-layer Distributed Bragg Reflector (DBR), and one generalized embodiment is shown in FIG. 1. As shown in FIG. 1, both top and bottom DBR mirrors are used, which makes the fabrication of such a VCSEL with one pair of dual intra-cavity contacts difficult and the fabrication of such a VCSEL with two pair of dual intra-cavity contacts extremely difficult.

FIG. 2 illustrates another generalized example of a prior art VCSEL structure. As shown in FIG. 2, the VCSEL structure includes one pair of intra-cavity contacts (i.e. one p-contact 202 and one n-contact 204). A top mirror 206 may be a deposited dielectric for maximum processing flexibility and VCSEL reliability. This contact is in stark contrast to the top DBR mirror used in the device shown in FIG. 1. The bottom mirror 208 of the FIG. 2 device can be epitaxially grown and is a semiconductor DBR. The n-contact 204 is disposed on the bottom mirror 208. The VCSEL mesa includes the active quantum-well region 210, a current confinement aperture 212, and the remainder of the optical cavity 214. The p-contact 202 is disposed on top of the VCSEL mesa. The dielectric top mirror 206 is placed as the last step of the fabrication process, completing the cavity structure. The pair of contacts 202, 204 are intra-cavity because they bypass the mirror pairs.

Therefore, what is needed is a VCSEL that provides fast switching of the polarization state without the limitations of the conventional art.

SUMMARY OF THE INVENTION

The present invention achieves very fast switching of the polarization-state of the output laser light. The high finesse of the vertical cavity laser enhances small anisotropies in the device, which are caused by injecting current along a uni-axial direction into the aperture and result in the polarization state of the device being fixed orthogonally to the direction of current flow. In an exemplary design intended to achieve polarization switching with approximately equal power outputs in both polarization states and with a high polarization contrast ratio, the aperture typically is small and symmetric, as in, for example, a rectangle. Two orthogonal current paths are established. The anode and cathode of a first current path are positioned along a first pair of opposite sides of the aperture, while the corresponding anode and cathode of a second, independent current path are positioned along the remaining pair of opposite sides of the aperture.

The present invention enables the creation of, along with other aspects, a single-mode, current-injected semiconductor laser with very high-modulation speed (i.e., in excess of 40 Gbit/s and potentially the intrinsic bandwidth ($f_{max}$) of the VCSEL) that can be useful in, for example, optical communication, optical imaging and optical sensing applications.

Other advantages of various implementations of the present invention include, but are not limited to (nor intended to be limited by):

the ability to decouple the laser turn-on current from the switching mechanism resulting in a low (i.e., near-zero) chirp;

the ability to provide a constant-current, constant electrical power device, thereby reducing the difficulty of thermal dissipation, and packaging;

the ability to achieve high-speed and high extinction ratio simultaneously in a VCSEL because bias points are decoupled from the extinction ratio (a feature not available with a conventional current-intensity modulated VCSELs);

the ability to enable link operation in single-ended mode by converting polarization modulation to intensity modulation; or alternatively, to allow link operation naturally in differential mode (if both polarizations are carried to separate receivers); and the ability to decouple the aperture size of the VCSEL from its modulation speed. This offers a more reliable high-speed design because current density can be reduced versus conventional high speed VCSEL due to the fact that peak currents are lower and because larger aperture devices can be used.

Yet another feature of at least some embodiments of the present invention are that wavelength is naturally stabilized, such that current and temperature do not change as a function of modulation speed, modulation format, and the like.

BRIEF DESCRIPTION OF THE DRAWINGS

These and other advantages, aspects and features of the present invention will become apparent to those ordinarily skilled in the art upon review of the following description of specific embodiments of the invention in conjunction with the accompanying figures, wherein.

DETAILED DESCRIPTION OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using components known in the art, only those portions of such known components that are necessary for an understanding of the present invention will be described, while detailed descriptions of other portions of such known components will be omitted so as not to obscure the invention. Further, the present invention encompasses present and future known equivalents to the known components referred to herein by way of illustration.

Figure 3A:
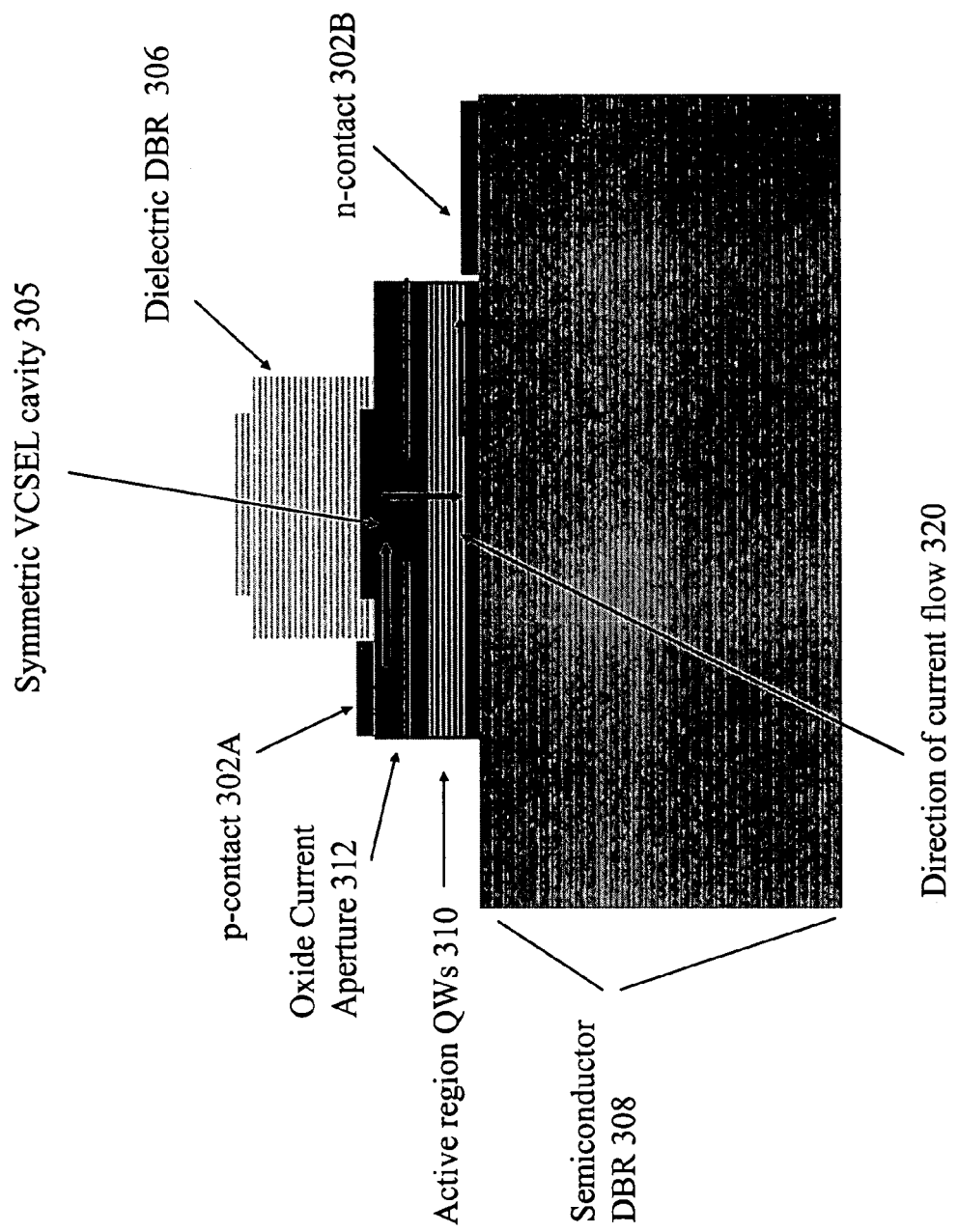
FIGS. 3A-B show an exemplary arrangement according the present invention with dual pairs of intra-cavity contacts made on a VCSEL with one DBR mirror and one deposited dielectric mirror.
Figure 3B:
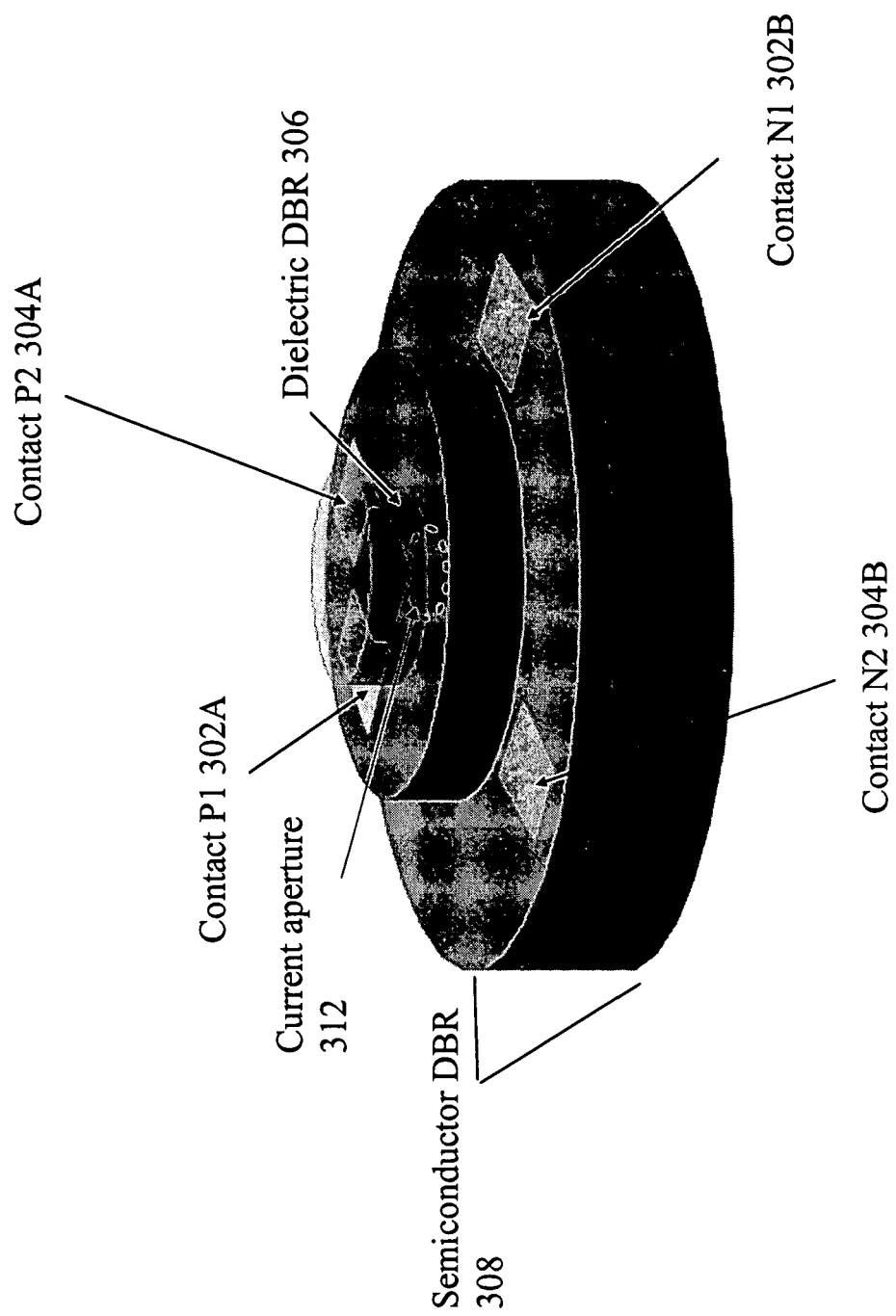

An embodiment of the present invention is shown in FIGS. 3A-B, which illustrate, respectively, a side elevation view and a perspective view of the invention. As shown, this embodiment of the present invention entails the use of two pairs of orthogonal, lateral-injection, contact electrodes, 302A,B & 304A,B, with a symmetric VCSEL cavity 305 and a dielectric top mirror 306 as a means for polarization switching via current steering. In an exemplary arrangement, the contact pairs 302A,B & 304A,B are arranged on opposite sides of the cavity so as to facilitate uniaxial flow of current across the cavity. The arrows of FIG. 3A illustrate this unidirectional current flow between corresponding contacts (i.e., 302A,B in this case). Polarization switching is achieved by changing the direction of this uniaxial current flow.

Figure 1:
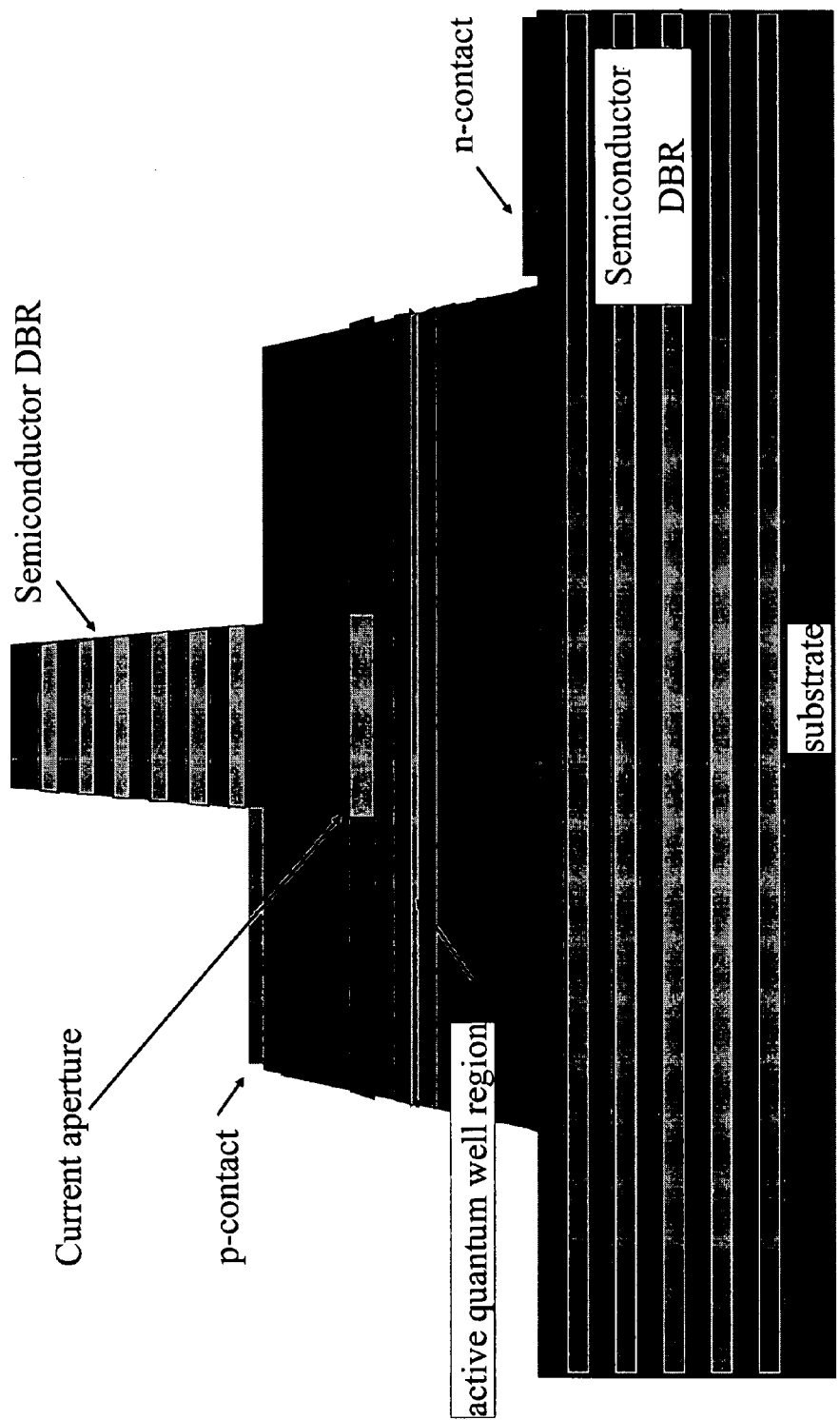
FIG. 1 shows a generalized structure of the conventional VCSEL, wherein an intra-cavity contacted VCSEL uses both bottom and top epitaxially grown DBR mirrors.
Figure 2:
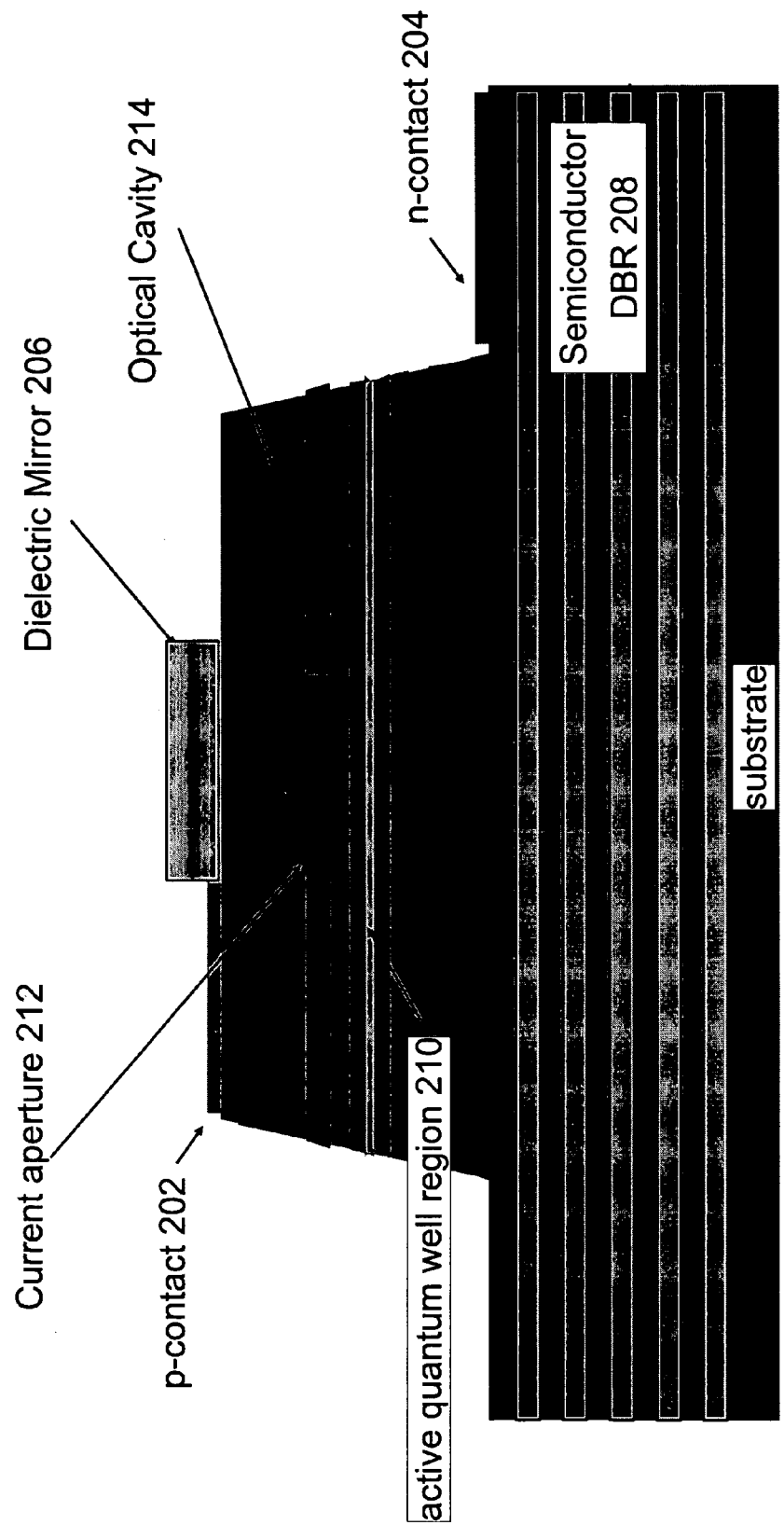
FIG. 2 shows a second generalized structure of the conventional VCSEL that has an intra-cavity contacted VCSEL with a bottom DBR mirror and a top deposited dielectric mirror.

The use of a relatively thin deposited dielectric mirror 306 allows both a current aperture 312 of predetermined size and the two pairs of intra-cavity contacts, 302A,B & 304A,B, to be accurately positioned with traditional photolithographic processes. The precise thickness of the dielectric mirror 306 is not a critical dimension of the present invention because current does not flow through the dielectric mirror 306, but flows under it and directly into the aperture. Thus, an aspect of the present invention is that the dielectric mirror 306 can be thinner than in the typical design of today. For example, in an 850 nanometer (nm) emitting VCSEL, the dielectric mirror 306 of the present invention can be on the order of 1 micron or less (or even omitted from the design altogether), while in the typical design the mirror (i.e., 206 of FIG. 2) will be at least 3 microns thick. Because the current flow "bypasses" the dielectric mirror 306 and does not have to flow vertically down (i.e. through) a relatively thick mirror, the direction of flow of current is more controlled (i.e., planar and unidirectional), which leads to the more improved polarization control of the emitted light.

By using this direct current injection into the aperture 312 (which can be much less than 1 micron thick), the present invention enables precise polarization control to be successfully achieved. This procedure avoids the need to define the aperture size by etching a narrow high-aspect ratio mesa or by using proton-implantation through potentially much thicker top-DBR mirror layers, and thus simplifies the fabrication process of the VCSEL. This type of mirror in small dimensions offers greater reliability, including a substantially reduced tendency to delaminate or degrade. The resulting VCSEL has the advantages of high-speed, high extinction ratio, and excellent reliability, attributes that are not simultaneously achievable in conventional current-intensity modulated VCSELs.

Manufacturing the VCSEL of the present invention is performed using typical semiconductor fabrication techniques as are well know in the art. An overview of such fabrication will now be provided. First, a semiconductor DBR 308 is fabricated on a substrate. Such a semiconductor DBR is known in the art. In this example, the semiconductor DBR 308 is approximately circular, with a diameter that can be of any size to support the remaining exemplary features. However, other geometric shapes can be used and the present invention is not intended to be limited to using a circular semiconductor DBR 308. The size of the semiconductor DBR 308 is not critical to the present invention; it could be the entire wafer or it could be selectively deposited in certain areas of the wafer.

Next, an active region (e.g. quantum well region) 310 is centrally disposed on top of the semiconductor DBR 308 using techniques that are known in the art. The active region 310 is also approximately circular and can have a diameter of from about 3 microns to over 20 microns, with typical values being between about 8 and 12 microns. As with the semiconductor DBR 308, other geometric shapes can be used for the active region 310 and are within the scope of the present invention. Part of the active region 310 includes the oxidized current aperture 312 and symmetric VCSEL cavity 305. Also disposed on top of the semiconductor DBR 308 are two n-contacts 302B, 304B, both of which are approximately square pads and about 10 to 50 microns on a side. However, the shape and size of the pads can vary and depend on the aperture size and capacitance targets, among other variables. The n-contacts 302B, 304B are place near the outside edge of, and adjacent to, the active region 310 and are spaced approximately 90 degrees apart.

On top of the active region 310, a dielectric DBR-306 is centrally disposed and is also approximately circular and about 20 to 100 microns in diameter, with different shapes and sizes possible. Such a dielectric DBR is known in the art. Also disposed on top of the dielectric DBR 306 are two p-contacts 302A, 304A, both of which are approximately square pads and about 10 to 50 microns on a side. However, the shape and size of the pads can vary and depend on the aperture size and capacitance targets, among other variables, as with the n-contacts 302B, 304B. The p-contacts 302A, 304A are placed near the outside edge of, and adjacent to, the dielectric DBR 306. The p-contacts 302A, 304A are approximately 90 degrees apart from one another, and also approximately 180 degrees apart from the corresponding n-contacts 302B, 304B, respectively.

It is worth noting again that the sizes and shapes of the parts that make up this embodiment of the VCSEL of the present invention are for example only. It will be readily apparent to those skilled in the art that there are many variations to these sizes and shapes, all of which are intended to be within the scope of the present invention. Further, the materials used for the VCSEL according to the present invention are the ones commonly used to create a VCSEL for any particular emission wavelength. For example, creating an 850 nm VCSEL might require GaAs & AlGaAs, while longer wavelength emissions might use a variety of other materials. The present invention is independent of wavelength, and therefore does not require the use of any particular materials.

In operation, current is supplied (not shown) to the two pair of independent intra-cavity p-contact electrodes and n-contact electrodes, the electrodes being positioned pairs along opposite sides of the aperture in a non-overlapping configuration. The anisotropy resulting from the unidirectional current flow of one electrode pair causes the light output to be polarized perpendicular to the direction of such current flow. Switching of the polarization state of the output light is achieved by using these two orthogonal pairs of non-overlapping intra-cavity contacted electrodes to switch the direction of current flow in the aperture VCSEL by 90 degrees (i.e., by switching the current flow from one pair to the other pair, the current flow within the VCSEL is switched by ±90 degrees, thereby switching the polarization state of the output light).

Figure 4:
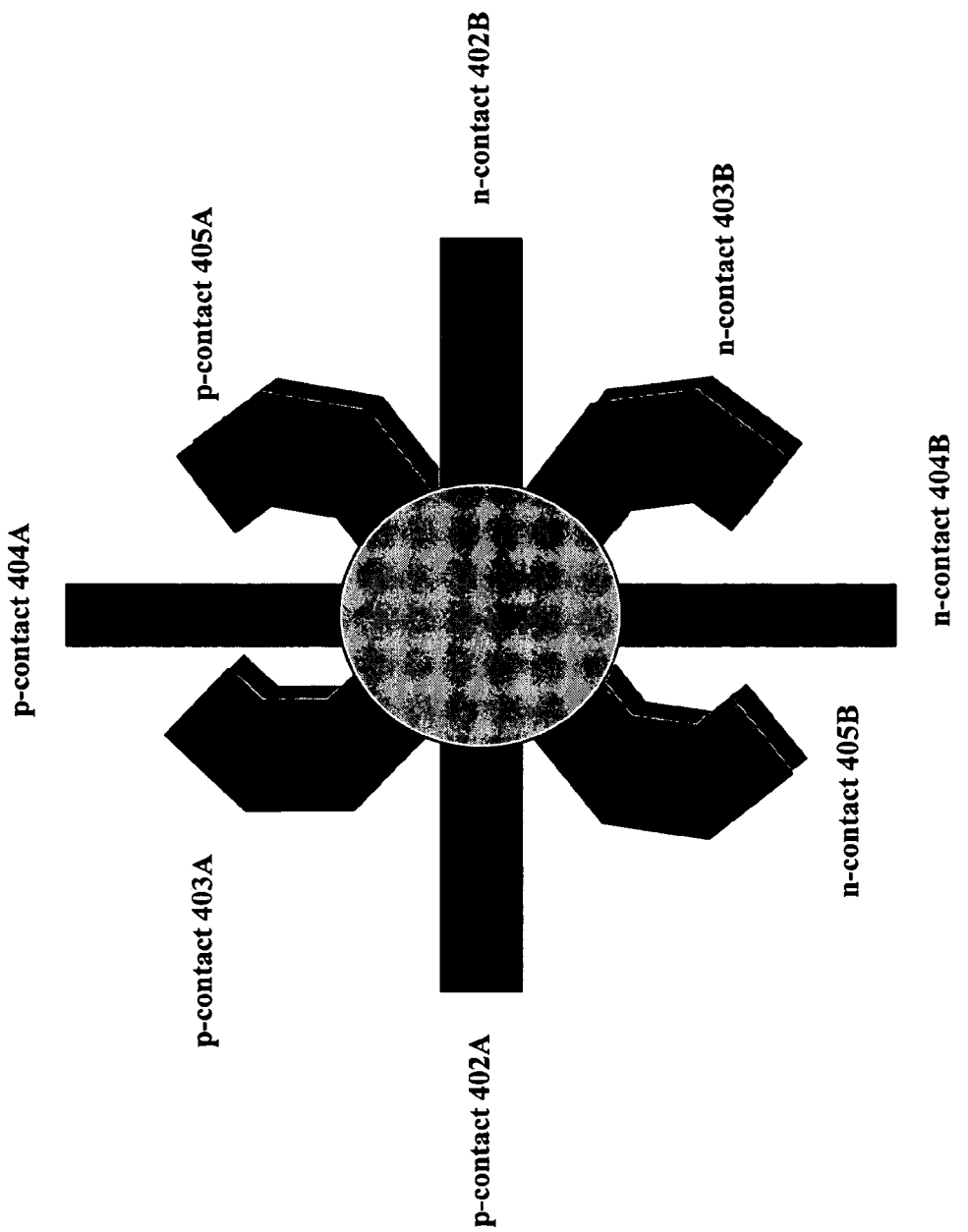
FIG. 4 shows an exemplary arrangement according to the present invention with four pairs of intra-cavity contacts made on a VCSEL.

FIG. 4 illustrates another embodiment of the present invention that allows a VCSEL to emit in one of multiple linear polarizations. As shown in FIG. 4, multiple pairs of electrodes, 402A-405A & 402B-405B, corresponding to multiple pairs of p-n contacts may be placed around the aperture. This enables unidirectional current flow and consequently laser emission in one of multiple linear polarization states. Although four pairs of contacts are illustrated, it will be apparent to those skilled in the art that any number of contact pairs may be fabricated, and such modifications are intended to be within the scope of the present invention.

Figure 5:
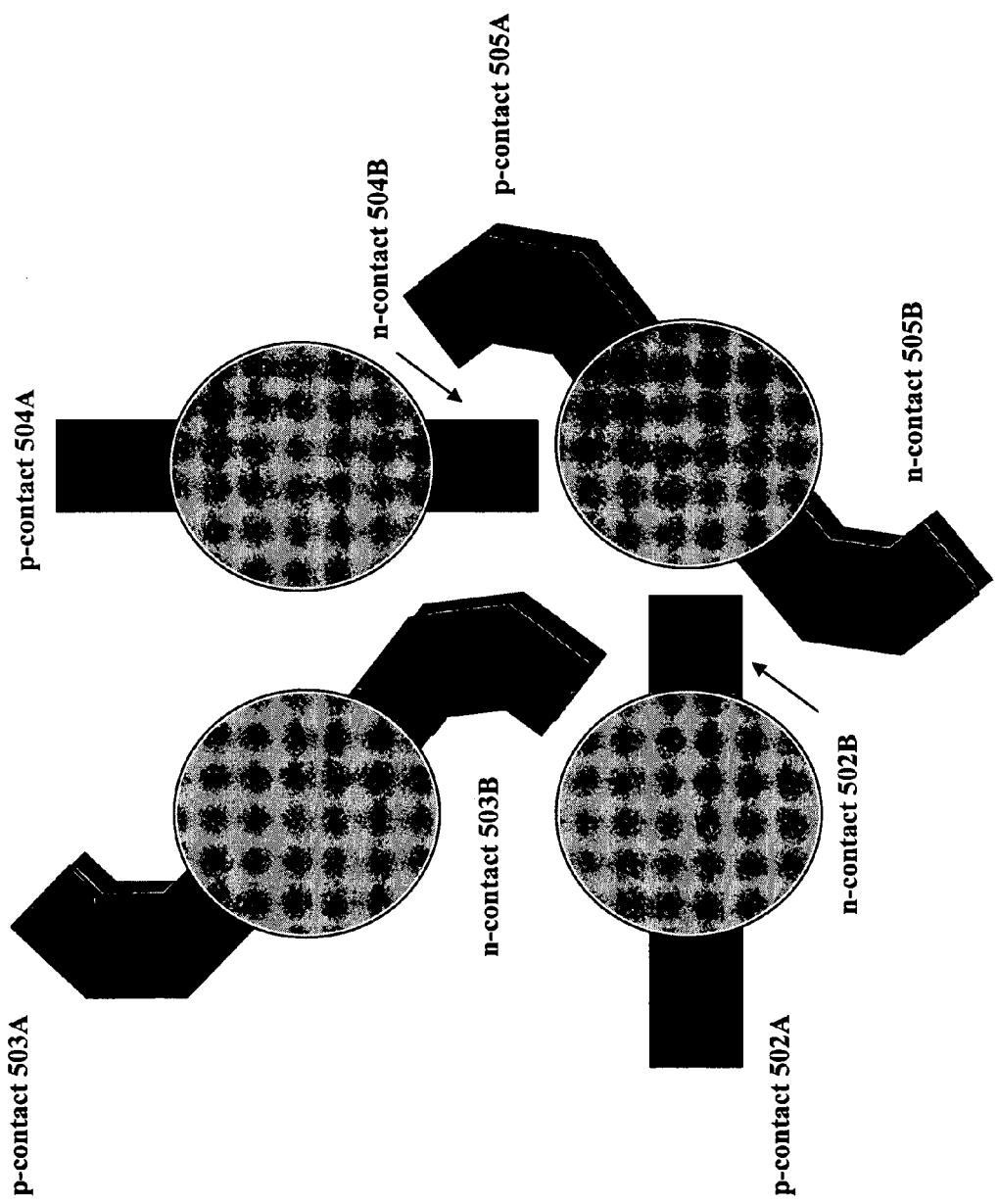
FIG. 5 shows another exemplary arrangement according to the present invention with four pairs of intra-cavity contacts made on separate neighboring VCSELs.

FIG. 5 illustrates an embodiment according to the present invention that permits simultaneous emission in multiple polarizations using multiple VCSEL cavities that are closely spaced with linear electrodes corresponding to the separate polarization states. As shown in FIG. 5, multiple pairs of p-n contacts 502A-505A & 502B-505B are placed around separate, closely spaced current apertures, enabling simultaneous unidirectional current-flow in each cavity between corresponding p-n contacts.

In another embodiment of the present invention, an exemplary structure maintains near-constant current in the device with minimal resistive differences between the current paths, which mitigates the RC effects and achieves polarization switching at high speeds. This design decouples the operating bias points (and hence optical output power) from the extinction ratio, thereby allowing independent optimization of each. Further, to mitigate thermal-heating effects, exemplary embodiments of the VCSEL structure according to the present invention may be operated at a lower than typical threshold, and well below rollover current. The rollover current depends on the particular VCSEL size; a typical commercial VCSEL may have a threshold of 2 milliamp (mA) and a rollover current of 15 mA. The important point for comparison to aspects of the present invention is that for typical VCSEL current modulation (i.e. modulating the intensity of the output light), the speed of the VCSEL is essentially proportional to the square root of the operating (i.e., bias) current density minus the threshold current density.

As an example of the previous discussion, suppose the typical VCSEL can be operated at a certain speed, X, by using a 3 mA bias, where $I_{bias}-I_{threshold}=1$ mA & $(1)^{1/2}=1$. Then to double the speed of the VCSE to 2X, the bias current would have to be increased to 6 mA, where $I_{bias}-I_{threshold}=4$ mA & $(4)^{1/2}=2$. Going one step further, to double the speed again to 4X, would require a bias current to 18 mA, where $I_{bias}-I_{threshold}=16$ mA & $(16)^{1/2}=4$ (i.e., but 18 mA is beyond the 15 mA rollover current). It can be seen then, that as the speed of the typical VCSEL is increased, the required current quickly grows, heating up the VCSEL. Thus, the output power and speed does not necessarily increase by merely increasing the bias current because of the accompanying detrimental thermal effects. When doing polarization modulation, the speed of the VCSEL is not related to its current density, but rather to how quickly the direction of the polarization of the light can be changed, which is related to the direction of current flow. Therefore, in the present invention, the speed of the VCSEL is decoupled from the bias current or output power of the VCSEL, and the detrimental heating effects are be a barrier to increasing speed. In an exemplary arrangement, one embodiment of a VCSEL device according to the present invention is operated at a threshold of below 1 mA using an oxide-confined aperture.

To mitigate mode-competition effects, one arrangement of the invention provides a single-mode VCSEL with a small aperture (i.e., 5 microns or less). When creating a VCSEL with an aperture having a lateral extent of between less than about 5 microns, laser emissions in a single transverse mode can be achieved. This single-mode VCSEL has advantages in high-speed fiber communication and optical storage applications. However, single-mode lasers typically have lower power emissions, and heat up at lower bias currents than do multimode lasers. Further, the single-mode lasers have unproven reliability. By combining the concepts of the present invention with a typical small-aperture VCSEL, the advantages of single-emissions are achieved without the negative heating effects.

In yet another embodiment of the present invention, the VCSEL is grown on a suitable substrate determined by the desired emission wavelength, for instance: at 850 nm, it is typical that the substrate will be GaAs; at 1.55 microns, materials such as InP could be used; at 1.3 microns, there are a various choices of materials. In this embodiment, the substrate also includes a monolithic tuning network to precisely tune the resistance of the device to approximately 50 Ohms (i.e., 100 Ohms differential). This tuning matches the output impedances of the VCSEL circuits, which has the beneficial effect of minimizing the electrical reflections within the device. This monolithic tuning network can be fabricated adjacent to, or close to, the VCSEL that it will tune. Other fabrication configurations are possible and are well known in the art. The idea is that the tuning network can be part of the same wafer rather than separately fabricated or discretely designed (i.e., designed on board using discrete elements).

From the foregoing, the present invention can be seen to provide a single-mode, current-injected semiconductor laser with high-modulation speeds (i.e., modulation speeds in excess of 40 Gbit/s), which can approach fmax of the VCSEL. The present invention allows link operation in single-ended mode by converting polarization modulation to intensity modulation; alternatively, it allows link operation naturally in differential mode (i.e., if both polarizations are carried to separate receivers). Further, the VCSEL of the present invention can be useful in, for example, optical communication, optical imaging and optical sensing applications.

As discussed, an embodiment of the VCSEL according to the present invention entails the use of two pairs of orthogonal lateral-injection contact electrodes with a single VCSEL cavity as a means for polarization switching via current steering. This design decouples the operating bias points (and hence optical output power) from the extinction ratio, thereby allowing independent optimization of each. In an exemplary arrangement (as previously described in relation to FIGS. 3A-B), the contact pairs are arranged on opposite sides of the VCSEL cavity so as to allow uniaxial flow of current across the cavity. Polarization switching is achieved by changing the direction of this uniaxial current flow. To mitigate RC effects and to achieve polarization switching at high speeds, an exemplary driver circuit for the VCSEL of the present invention should maintain near-constant current in the device with minimal resistive differences between the current paths.

Figure 6:
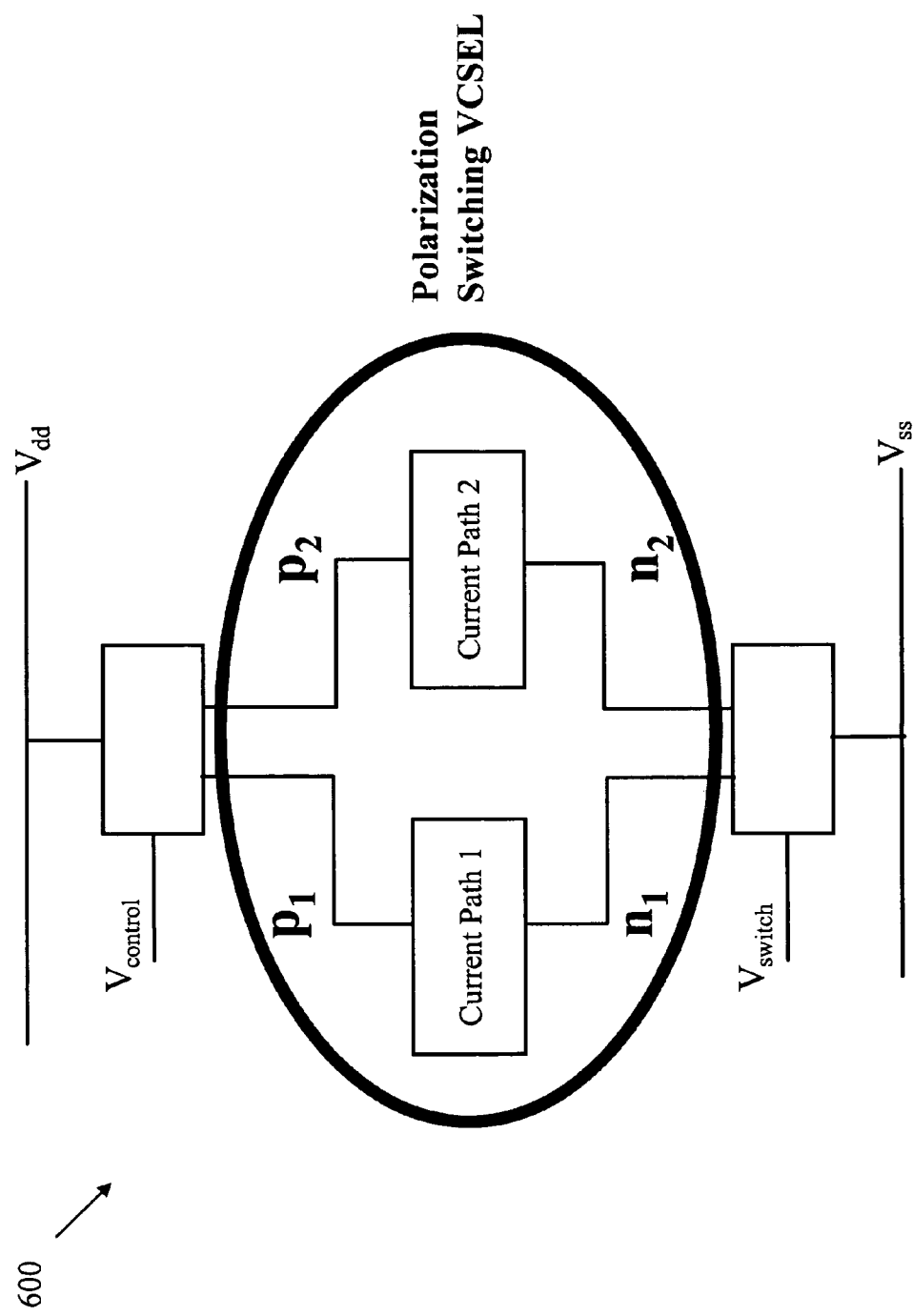
FIG. 6 shows a generalized circuit structure according to an embodiment of the present invention.

FIG. 6 shows a generalized driver circuit arrangement according to an embodiment of the present invention. As shown in FIG. 6, a control circuit is used to supply current under the control of a tuning voltage ($V_{control}$) into the polarization-switching VCSEL. The current is switched between two independent branches (p1-n1 and p2-n2) of the VCSEL using a switching circuit under the control of the input switching voltage ($V_{switch}$). In order to achieve correct operation of the disclosed VCSEL, current should flow between each designated pair of electrodes on opposite sides of the cavity and current should not flow between neighboring electrodes. To facilitate this, the driver circuit should break the degeneracy between the two pairs of contact electrodes to prevent forbidden (i.e., stray) currents from flowing. Several specific embodiments of polarization-switching VCSEL driver circuits are now presented to exemplify the driver circuit concepts described.

Figure 7:
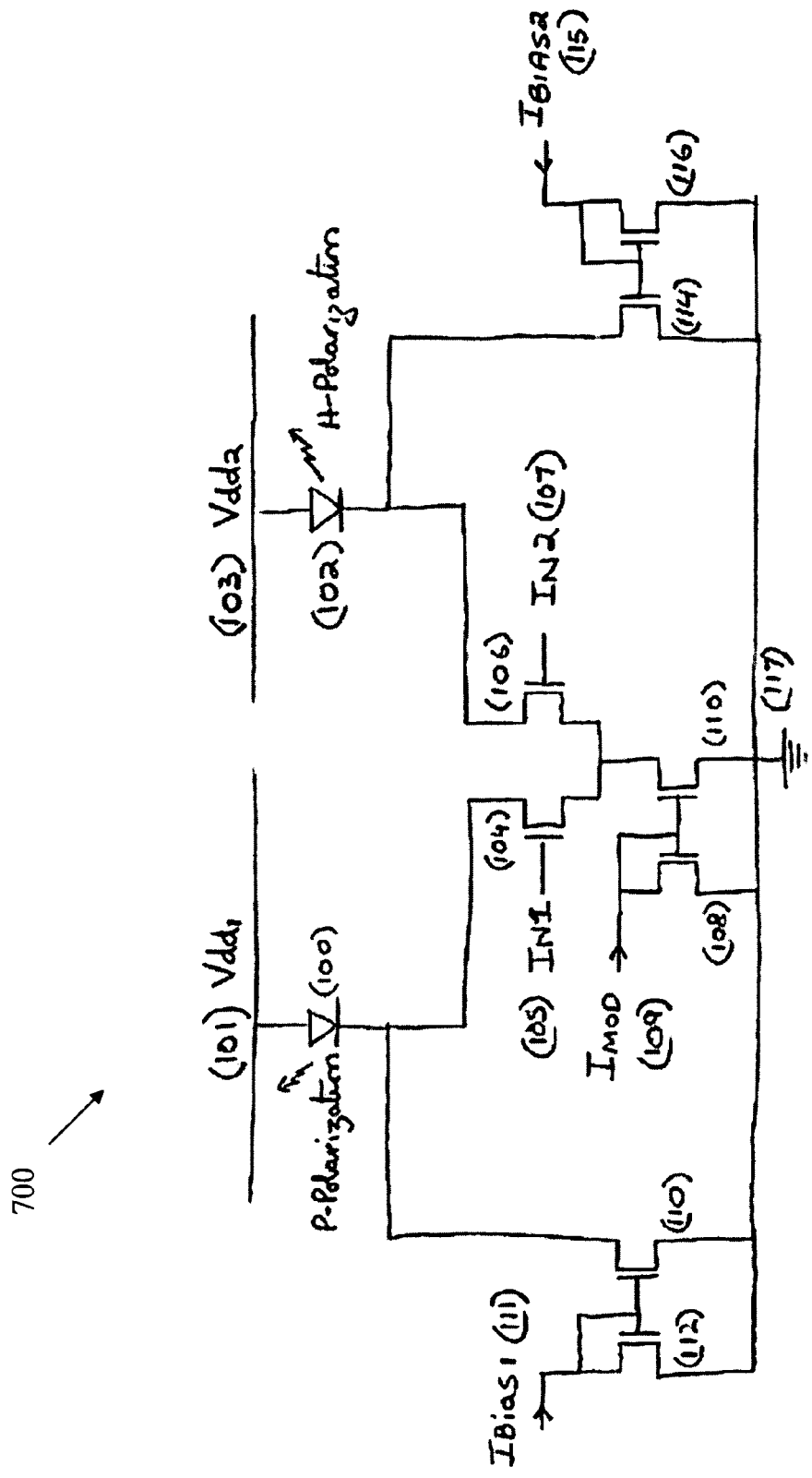
FIG. 7 shows a first embodiment of the VCSEL driver circuit according to the present invention.

FIG. 7 shows a first VCSEL driver circuit embodiment 700 of the invention. For the purposes of FIG. 7, the horizontal polarization emission 100 and the vertical polarization emission 102 are shown separately. The p-contact of the respective orthogonal contact electrodes are attached to separate voltage supplies $V_{dd1}$ 101 and $V_{dd2}$ 103, respectively. Transistors 110 and 112 provide a mirrored adjustable bias current $I_{bias1}$ 111 to p-polarized laser light emission. Transistors 114 and 116 correspondingly provide a mirrored adjustable bias current $I_{bias2}$ 115 to h-polarized emissions. The transistors 104 and 106 represent a differential pair driven by digital inputs IN1 105 and IN2 107 that steer the adjustable modulation current $I_{mod}$ 109 generated by transistors 108 and 110 between the two branches of the circuit. The circuit uses a common ground line 117. During operation of the driver circuit 500, current is steered between the two independent branches of the VCSEL under the control of differential inputs. The separate supply voltages are used to isolate the p-contacts of the VCSEL. The circuit 700 provides independent bias currents for each polarization component of the VCSEL.

Figure 8:
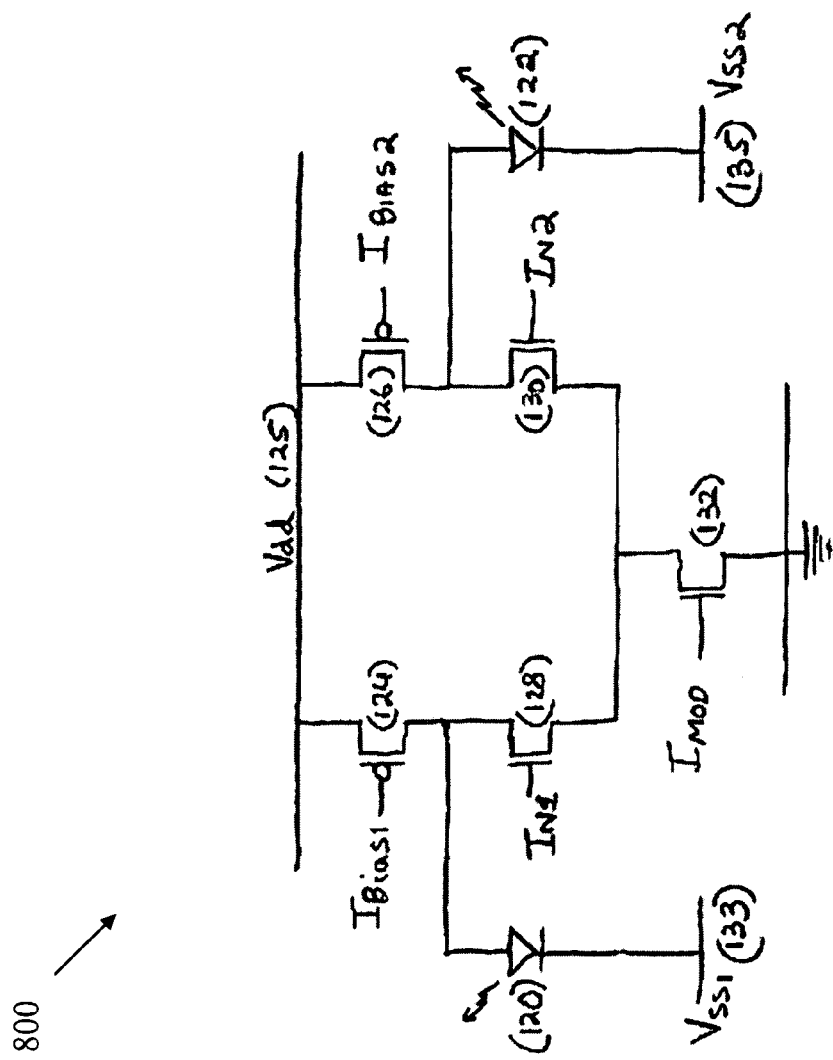
FIG. 8 shows a second embodiment of the VCSEL driver circuit according to the present invention.

FIG. 8 shows a second VCSEL driver circuit embodiment 800 of the invention. As shown in FIG. 8, a variation to the circuit described in FIG. 8 would be to use a common positive supply line $V_{dd}$ 125 with separate negative supply lines $V_{ss1}$ 133 and $V_{ss2}$ 135 connected, respectively, to the n-contacts of the horizontal polarized emission 120 and vertical polarized emission 122. The respective bias currents for each branch of the circuit, $I_{bias1}$ and $I_{bias2}$, can be generated by a simple voltage controlled current sources 124 and 126, respectively. The transistors 128 and 130 represent a pair driven by digital inputs IN1 and IN2 that steer the adjustable modulation current $I_{mod}$ generated by transistor 132 between the two branches of the circuit. Alternately, $I_{bias1}$ and $I_{bias2}$ could be generated by mirror current sources as in FIG. 7.

Other variations of these two driver circuits can be easily imagined by those skilled in the art; such variations are intended to be within the scope of the present invention. For example, in FIG. 7, adjustable bias currents $I_{bias1}$ 111 and $I_{bias2}$ 115 can be replaced with a digital-to-analog converter for precise external digital control. Although FIG. 7 is illustrated using CMOS transistors, the transistors could easily be replaced with bipolar junction transistors for certain high-speed applications. Additionally, discrete components could be used where integrated circuits have been shown. Further, fixed differential input transistors 104 and 106 could be replaced with a bank of different sized transistors chosen to optimize the current steering speed based on the value of $I_{mod}$. Corresponding variations for the circuit in FIG. 8 could be used.

Figure 9:
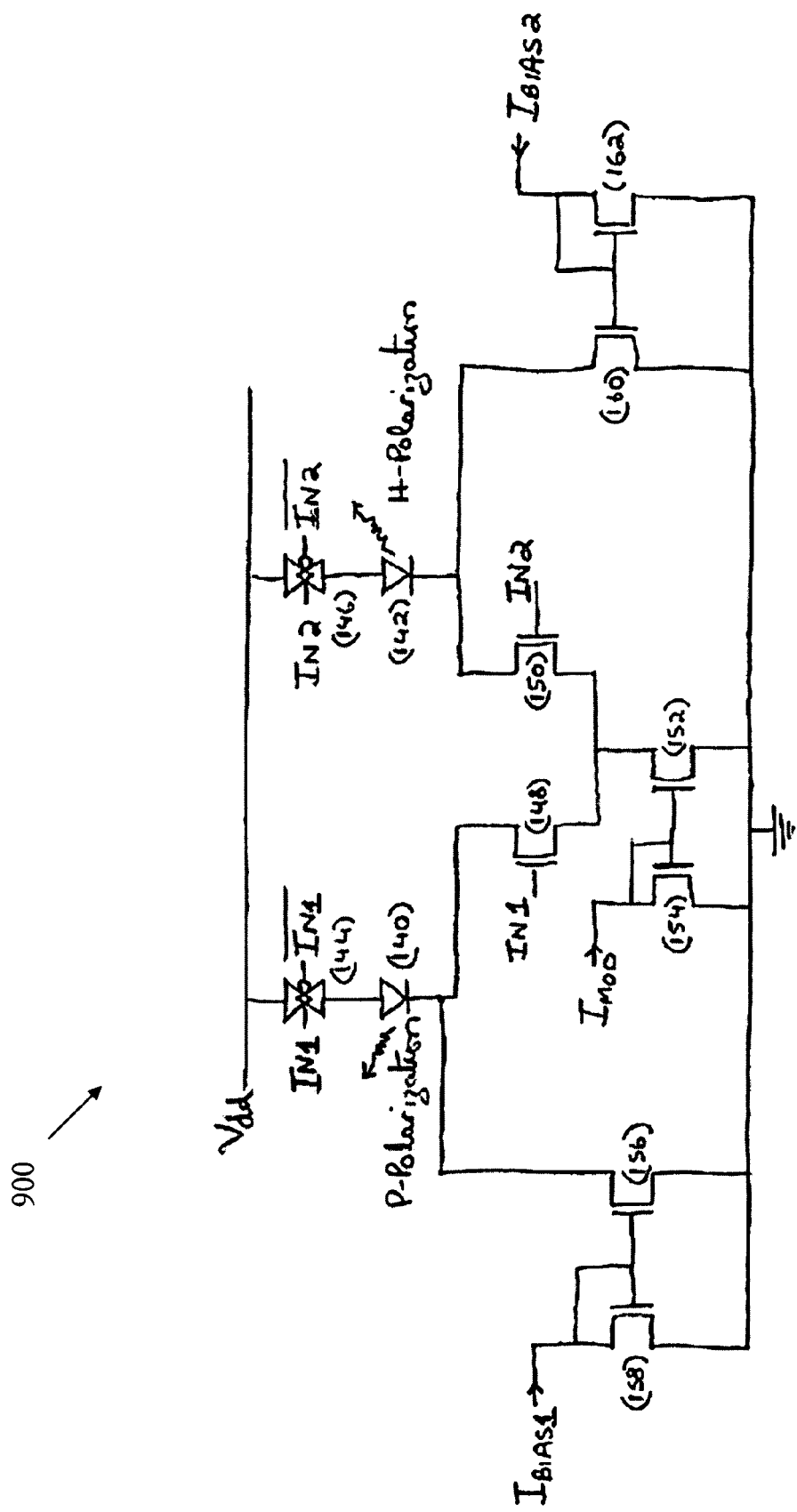
FIG. 9 shows a third embodiment of the VCSEL driver circuit according to the present invention.

FIG. 9 shows a third VCSEL driver circuit embodiment 900 of the invention. FIG. 9 illustrates a driver circuit technique to break the degeneracy of the contacts and achieve proper circuit operation by providing current switching transistors for both the positive and negative supply lines. In this variation of the original circuit 700 shown in FIG. 7, pass transistors 146 and 146 are inserted between a common positive supply line $V_{dd}$ and the p-polarized and h-polarized emissions, respectively. Pass transistor 144 serves to enable current to flow in the left branch of the circuit, as shown, when input IN1 is high and IN2 is low, while pass transistor 146 simultaneously stops current flow in the right branch of the circuit. Vice-versa, when IN1 is low and IN2 is high, pass transistor 144 prevents the left-hand side of the circuit from drawing current, whereas pass transistor 146 allows current to flow into the right-hand side. This removes VCSEL contact degeneracy while using a common supply voltage line $V_{dd}$.

Figure 10:
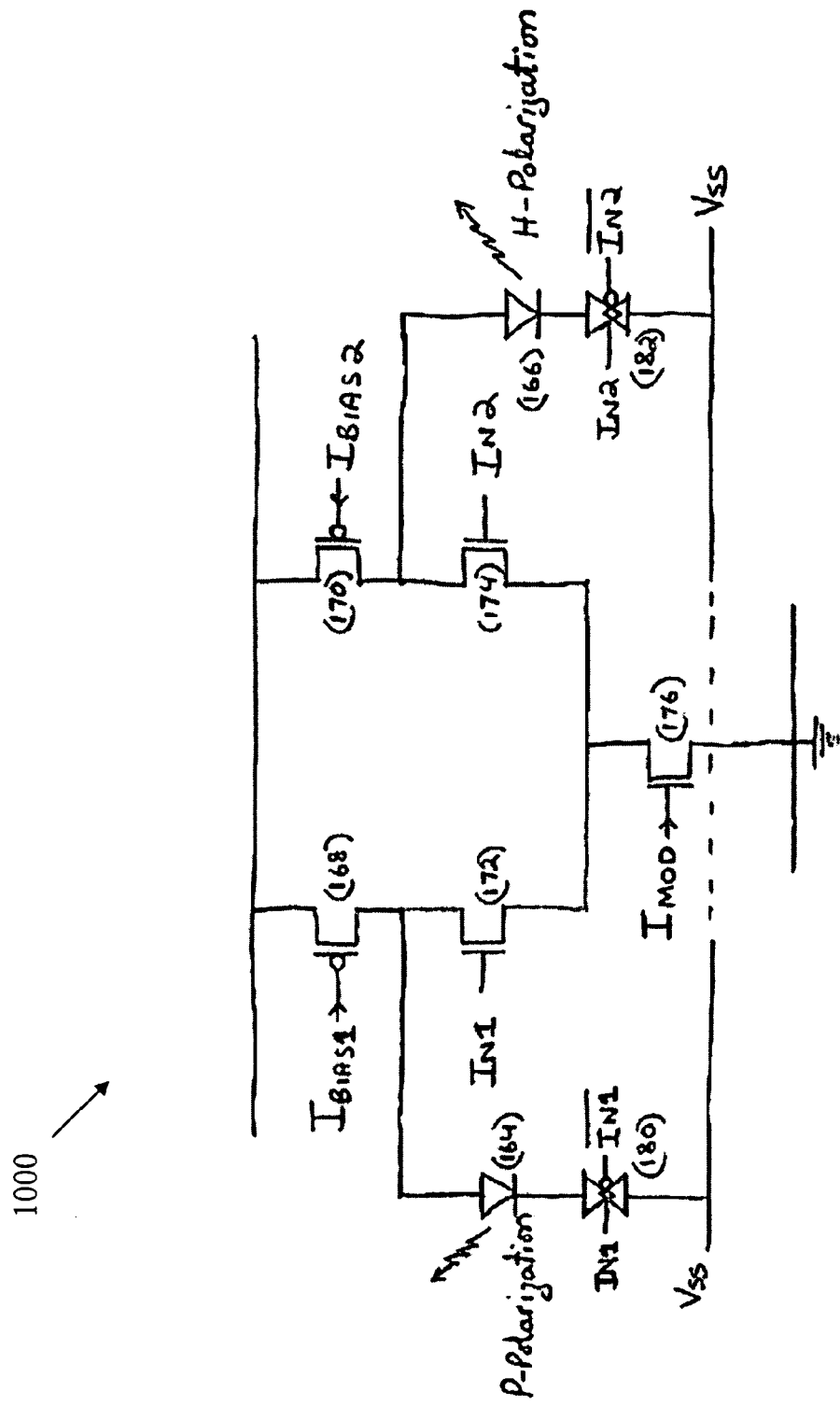
FIG. 10 shows a fourth embodiment of the VCSEL driver circuit according to the present invention.

FIG. 10 shows a fourth VCSEL driver circuit embodiment 1000 of the invention. FIG. 10 shows a driver circuit 1000 derived from FIG. 8, using the technique of FIG. 9, above. As shown in FIG. 10, pass transistors 180 and 182 are inserted between a common ground line $V_{ss}$ and the p-polarized 164 and h-polarized 166 emissions, respectively. When IN1 is high and IN2 is low, pass transistor 180 shutters on and pass transistor 182 respectively shutters off, enabling current to flow into the p-polarized VCSEL contacts 164 and simultaneously preventing current from flowing into the h-polarized VCSEL contacts 166. Vice-versa, when IN2 is high and IN1 is low, the pass transistors 180 and 182 respectively allow current to flow into the h-polarized VCSEL contacts 166 and prevent current flow into the p-polarized contacts 164. Corresponding circuit variations for generating the $I_{bias}$ currents are possible for the circuits of FIGS. 9 and 10 as discussed previously for the circuits of FIGS. 7 and 8.

Although the present invention has been particularly described with reference to the preferred embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of components and contacts illustrated in the figures. Further, while the VCSEL structure of the exemplary figures is shown to be circular, it should be understood that any geometric shape can be fabricated as part of the present invention. It is intended that the appended claims include such changes and modifications.

What is claimed is:

1. A vertical cavity surface emitting laser (VCSEL) capable of polarization switching, comprising:
    a VCSEL cavity comprising top and bottom dielectric mirrors and an active region positioned between the top and the bottom dielectric mirrors, the active region being operable to emit light under excitation by an electric current and comprising a current aperture operable to confine the electric current;
    first and second top electrodes spaced from each other and disposed on the active region near a bottom periphery of the top mirror;
    first and second bottom electrodes spaced from each other and disposed on the bottom mirror near a bottom periphery of the active region, wherein the first top and the first bottom electrodes are approximately 180 degrees from each other to supply the electric current to the active region in a first direction to control the emitted light in a first polarization, and the second top and the second bottom electrodes are approximately 180 degrees from each other to supply the electric current to the active region in a second direction to control the emitted light in a second polarization; and
    a driver circuit coupled to the first and second top electrodes and the first and second bottom electrodes and operable to supply the electric current to flow in either of the first and the second directions and operable to switch the polarization of the emitted light between the first and the second polarizations.

2. The laser as in claim 1, wherein the driver circuit comprises:
    a first voltage supply connected to the first top electrode;
    a first bias current circuit having a first terminal connected to the first bottom electrode and a second terminal connected to a common ground and operable to supply a first bias current as a part of the electric current to the active region via the first top and bottom electrodes;
    a second voltage supply connected to the second top electrode;
    a second bias current circuit having a first terminal connected to the second bottom electrode and a second terminal connected to the common ground and operable to supply a second bias current as a part of the electric current to the active region via the second top and bottom electrodes;
    a modulation current circuit connected between the common ground and the first and second bottom electrodes and operable to supply a modulated current as part of the electric current to the active region to modulate the emitted light; and
    a switching circuit coupled between the modulation current circuit and the first and second bottom electrodes and operable to switch the modulated current to flow either through the first bottom electrode when the emitted light is controlled to be in the first polarization or through the second bottom electrode when the emitted light is controlled to be in the second polarization.

3. The laser as in claim 2, wherein the switching circuit comprises a differential pair of transistors that receive first and second gate control signals, respectively.

4. The laser as in claim 2, wherein each of the first bias current circuit, the second bias current circuit and the modulation current circuit is a current mirror circuit comprising two transistors.

5. The laser as in claim 1, wherein the driver circuit comprises:
- a first voltage supply connected to the first bottom electrode;
- a first bias current circuit having a first terminal connected to the first top electrode and a second terminal connected to a common ground and operable to supply a first bias current as a part of the electric current to the active region via the first top and bottom electrodes;
- a second voltage supply connected to the second bottom electrode;
- a second bias current circuit having a first terminal connected to the second top electrode and a second terminal connected to the common ground and operable to supply a second bias current as a part of the electric current to the active region via the second top and bottom electrodes;
- a modulation current circuit connected between the common ground and the first and second top electrodes and operable to supply a modulated current as part of the electric current to the active region to modulate the emitted light; and
- a switching circuit coupled between the modulation current circuit and the first and second top electrodes and operable to switch the modulated current to flow either through the first top electrode when the emitted light is controlled to be in the first polarization or through the second top electrode when the emitted light is controlled to be in the second polarization.

6. The laser as in claim 5, wherein the switching circuit comprises a differential pair of transistors that receive first and second gate control signals, respectively.

7. The laser as in claim 5, wherein each of the first bias current circuit, the second bias current circuit and the modulation current circuit is a current mirror circuit comprising two transistors.

8. The laser as in claim 1, wherein the driver circuit comprises:
- a common voltage supply to supply a voltage relative to a common ground;
- a first switch connected between the first top electrode and the common voltage supply to switch on and off the voltage to the first top electrode;
- a first bias current circuit having a first terminal connected to the first bottom electrode and a second terminal connected to the common ground and operable to supply a first bias current as a part of the electric current to the active region via the first top and bottom electrodes;
- a second switch connected between the second top electrode and the common voltage supply to switch on and off the voltage to the second top electrode;
- a second bias current circuit having a first terminal connected to the second bottom electrode and a second terminal connected to the common ground and operable to supply a second bias current as a part of the electric current to the active region via the second top and bottom electrodes;
- a modulation current circuit connected between the common ground and the first and second bottom electrodes and operable to supply a modulated current as part of the electric current to the active region to modulate the emitted light; and
- a switching circuit coupled between the modulation current circuit and the first and second bottom electrodes and operable to switch the modulated current to flow either through the first bottom electrode when the emitted light is controlled to be in the first polarization or through the second bottom electrode when the emitted light is controlled to be in the second polarization.

9. The laser as in claim 8, wherein the switching circuit comprises a differential pair of transistors that receive first and second gate control signals, respectively.

10. The laser as in claim 8, wherein each of the first bias current circuit, the second bias current circuit and the modulation current circuit is a current mirror circuit comprising two transistors.

11. The laser as in claim 1, wherein the driver circuit comprises:
- a common voltage supply to supply a voltage relative to a common ground;
- a first switch connected between the first bottom electrode and the common voltage supply to switch on and off the voltage to the first bottom electrode;
- a first bias current circuit having a first terminal connected to the first top electrode and a second terminal connected to the common ground and operable to supply a first bias current as a part of the electric current to the active region via the first top and bottom electrodes;
- a second switch connected between the second bottom electrode and the common voltage supply to switch on and off the voltage to the second bottom electrode;
- a second bias current circuit having a first terminal connected to the second top electrode and a second terminal connected to the common ground and operable to supply a second bias current as a part of the electric current to the active region via the second top and bottom electrodes;
- a modulation current circuit connected between the common ground and the first and second top electrodes and operable to supply a modulated current as part of the electric current to the active region to modulate the emitted light; and
- a switching circuit coupled between the modulation current circuit and the first and second top electrodes and operable to switch the modulated current to flow either through the first top electrode when the emitted light is controlled to be in the first polarization or through the second top electrode when the emitted light is controlled to be in the second polarization.

12. The laser as in claim 11, wherein the switching circuit comprises a differential pair of transistors that receive first and second gate control signals, respectively.

13. The laser as in claim 11, wherein each of the first bias current circuit, the second bias current circuit and the modulation current circuit is a current mirror circuit comprising two transistors.

14. The laser as in claim 1, wherein the driver circuit comprises:
- a common voltage supply to supply a voltage relative to a common ground;
- a first bias control transistor connected between the first top electrode and the common voltage supply and operable to control a first bias current as a part of the electric current to the active region via the first top and bottom electrodes;
- a first voltage supply connected to the first bottom electrode and operable to supply a first voltage relative to the common ground in producing the first bias current;

a second bias control transistor connected between second top electrode and the common voltage supply and operable to control a second bias current as a part of the electric current to the active region via the second top and bottom electrodes;

a second voltage supply connected to the first bottom electrode and operable to supply a second voltage relative to the common ground in producing the second bias current;

a modulation transistor connected between the common ground and the first and second top electrodes and operable to produce a modulation on the electric current to the active region to modulate the emitted light in response to a modulation control signal;

a switching circuit coupled between the modulation transistor and the first and second top electrodes and operable to switch the modulation to the electric current flowing either through the first top electrode when the emitted light is controlled to be in the first polarization or through the second top electrode when the emitted light is controlled to be in the second polarization.

15. The laser as in claim 14, wherein the switching circuit comprises a differential pair of transistors that receive first and second gate control signals, respectively.

16. The laser as in claim 1, wherein the driver circuit comprises:

a common voltage supply to supply a voltage relative to a common ground;

a first bias control transistor connected between the first bottom electrode and the common voltage supply and operable to control a first bias current as a part of the electric current to the active region via the first top and bottom electrodes;

a first voltage supply connected to the first top electrode and operable to supply a first voltage relative to the common ground in producing the first bias current;

a second bias control transistor connected between second bottom electrode and the common voltage supply and operable to control a second bias current as a part of the electric current to the active region via the second top and bottom electrodes;

a second voltage supply connected to the first top electrode and operable to supply a second voltage relative to the common ground in producing the second bias current;

a modulation transistor connected between the common ground and the first and second bottom electrodes and operable to produce a modulation on the electric current to the active region to modulate the emitted light in response to a modulation control signal;

a switching circuit coupled between the modulation transistor and the first and second bottom electrodes and operable to switch the modulation to the electric current flowing either through the first bottom electrode when the emitted light is controlled to be in the first polarization or through the second bottom electrode when the emitted light is controlled to be in the second polarization.

17. The laser as in claim 16, wherein the switching circuit comprises a differential pair of transistors that receive first and second gate control signals, respectively.

18. The laser as in claim 1, wherein the driver circuit comprises:

a first common voltage supply to supply a first voltage relative to a common ground;

a first bias control transistor connected between the first top electrode and the first common voltage supply and operable to control a first bias current as a part of the electric current to the active region via the first top and bottom electrodes;

a second common voltage supply connected to the first and the second bottom electrodes and operable to supply a second voltage relative to the common ground;

a second bias control transistor connected between second top electrode and the first common voltage supply and operable to control a second bias current as a part of the electric current to the active region via the second top and bottom electrodes;

a second voltage supply connected to the first and the second bottom electrodes and operable to supply a second voltage relative to the common ground in producing the first and the second bias currents;

a first switch connected between the second common voltage supply and the first bottom electrode to switch on and off the second voltage to the first bottom electrode;

a second switch connected between the second common voltage supply and the second bottom electrode to switch on and off the second voltage to the second bottom electrode;

a modulation transistor connected between the common ground and the first and second top electrodes and operable to produce a modulation on the electric current to the active region to modulate the emitted light in response to a modulation control signal; and a switching circuit coupled between the modulation transistor and the first and second top electrodes and operable to switch the modulation to the electric current flowing either through the first top electrode when the emitted light is controlled to be in the first polarization or through the second top electrode when the emitted light is controlled to be in the second polarization.

19. The laser as in claim 1, wherein the driver circuit comprises:

a first common voltage supply to supply a first voltage relative to a common ground;

a first bias control transistor connected between the first bottom electrode and the first common voltage supply and operable to control a first bias current as a part of the electric current to the active region via the first top and bottom electrodes;

a second common voltage supply connected to the first and the second top electrodes and operable to supply a second voltage relative to the common ground;

a second bias control transistor connected between second bottom electrode and the first common voltage supply and operable to control a second bias current as a part of the electric current to the active region via the second top and bottom electrodes;

a second voltage supply connected to the first and the second top electrodes and operable to supply a second voltage relative to the common ground in producing the first and the second bias currents;

a first switch connected between the second common voltage supply and the first top electrode to switch on and off the second voltage to the first top electrode;

a second switch connected between the second common voltage supply and the second top electrode to switch on and off the second voltage to the second top electrode;

a modulation transistor connected between the common ground and the first and second bottom electrodes and operable to produce a modulation on the electric current to the active region to modulate the emitted light in response to a modulation control signal; and a switching circuit coupled between the modulation transistor and the first and second bottom electrodes and operable to switch the modulation to the electric current flowing either through the first bottom electrode when the emitted light is controlled to be in the first polarization or through the second bottom electrode when the emitted light is controlled to be in the second polarization.

20. The laser as in claim 1, wherein the driver circuit comprises:

a first current path comprising the first top electrode, the active region and the first bottom electrode, wherein the first current path is operable to supply the electric current in the first direction;

a second current path comprising the second top electrode, the active region and the second bottom electrode, wherein the second current path is operable to supply the electric current in the second direction; and a switch to switch the electric current between the first and the second current paths, wherein the first and second bottom electrodes are electrically insulated from each other, and the first and second top electrodes are insulated from each other, and wherein the first and second current paths have approximately equal path resistances.

* * * * *